United States Patent
Greitschus

(10) Patent No.: US 6,411,240 B1
(45) Date of Patent: Jun. 25, 2002

(54) AMPLIFIER HAVING A NOISE SOURCE FOR AN ANALOG-TO-DIGITAL CONVERTER

(75) Inventor: Norbert Greitschus, Endingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/479,518

(22) Filed: Jan. 7, 2000

(30) Foreign Application Priority Data

Jan. 9, 1999 (DE) .......................................... 199 00 558

(51) Int. Cl.$^7$ ............................................... H03M 1/12

(52) U.S. Cl. ........................................... 341/155; 330/9

(58) Field of Search .............................. 341/155; 330/9, 330/260, 263, 252, 98

(56) References Cited

U.S. PATENT DOCUMENTS

| | | | |
|---|---|---|---|
| 3,748,587 A | * | 7/1973 | Aumiaux |
| 4,145,666 A | * | 3/1979 | Seki ........................... 330/265 |
| 4,544,897 A | * | 10/1985 | Ishikawa ................. 331/116 R |
| 6,040,732 A | * | 3/2000 | Brokaw ...................... 327/408 |

OTHER PUBLICATIONS

Motorola Technical Disclosure Bulletin, vol. 1, No. 1, Aug. 1980, "Dual Differential Amplifier" by Paul F. Smith.

\* cited by examiner

*Primary Examiner*—Peguy Jeanpierre
(74) *Attorney, Agent, or Firm*—Samuels, Gauthier & Stevens LLP

(57) ABSTRACT

An amplifier has a first amplifier stage with a first input terminal to which an input signal is applied and with an output terminal that is connected to an input terminal of a second amplifier stage located downstream. The second amplifier stage provides an output signal that is fed back to a second input terminal of the first amplifier stage through a feedback path, which preferably contains a passive network. The amplification of this combination of the first and second amplifier stages with feedback depends essentially on the parameters of the network in the feedback path. The amplifier according to the invention also has a noise source that is connected in parallel with the first amplifier stage, and is also connected to the input terminal of the second amplifier stage. The level of a signal component at the output of the second amplifier stage depends on the parameters of the network in the feedback branch and the amplification of the first amplifier stage. These values are variable and can be adjusted such that the level of the signal component provided by the noise source is independent of the amplification of the amplifier. One embodiment of the passive network comprises a voltage divider, with one tap of the voltage divider connected to the second input terminal of the first amplifier stage. A k-fold multiple of the output signal at the second amplifier stage is applied to the second input terminal of the first amplifier stage, with the feedback factor k depending on the voltage divider ratio. The amplification of the first amplifier stage may also be adjustable as a function of the feedback factor k. In one embodiment, the first amplifier stage contains a plurality of amplifiers connected in parallel that can be switched as a function of the feedback factor k. The amplifiers of the first amplifier stage are therefore preferably designed as differential amplifiers.

12 Claims, 3 Drawing Sheets

AMPLIFIER HAVING A NOISE SOURCE FOR AN ANALOG-TO-DIGITAL CONVERTER

BACKGROUND OF THE INVENTION

The present invention relates to an amplifier for an analog-to-digital (AD) converter that amplifies a useful signal prior to digitization by the AD converter.

One of the disadvantages of a system with an AD converter is that when the resolution is too low, the quantization of the input signal may be noticeable and cause interference. A resolution of 8-bits (256 different discrete values) has an accuracy sufficient for many applications in image processing. However, this quantization can often be seen in the image. For example, if the analog values correspond to the brightness values of a line-scanned image in which the brightness changes continuously in the horizontal direction, then only 256 different brightness values can be reconstructed from the 8-bit digitized signal for this example. The transitions from one brightness value to the next occur at the same position in every line, which appears to the human eye as a vertical stripe or an abrupt change in brightness.

One approach to solving this problem provides for superimposing a noise signal on the useful signal prior to quantization. The majority of the noise power is above the frequency range of the useful signal. Although this technique reduces the signal-noise ratio of the system, it results in an improved digitally reconstructed image. A random signal is superimposed on each analog value to be digitized, and the level of this signal is low in comparison with the level of the useful signal, ensuring that the same analog signals, depending on the amplitude of the random signal can be imaged at different discrete values at the output of the AD converter. The brightness values that come from one column of the scanned image are therefore not necessarily imaged on the same discrete values. In particular, analog values located in the boundary area between two quantization stages are imaged in random fashion at the higher or lower quantization levels. In the image obtained from the digitized values, the change from one brightness level to the next in different lines can occur at different positions that differ by a few image points so that the brightness change is no longer perceived as a jump by the human eye.

The noise signal whose average power is supposed to be constant is produced in known amplifiers by a resistance network or an additional adder amplifier, connected downstream of the output of the amplifier and upstream of the input of the AD converter. The resistance network has a particular disadvantage that it increases the output resistance of the amplifier while the AD converter requires a low output resistance of the amplifier located upstream, since otherwise the input signal errors of the AD converter increase at high frequencies. A disadvantage of the additional adder-amplifier is that the current draw and area occupied by the system increase.

In known amplifiers of this kind, the noise signal is superimposed on the input signal prior to amplification by the amplifier and as a result is amplified as well. Since the amplification of the amplifier is intended to be variable and the average power of the noise signal supplied to the AD converter is intended to remain constant, this solution requires that the noise signal always be adapted to the respective amplification.

SUMMARY OF THE INVENTION

Briefly, according to the present invention, an amplifier has a first amplifier stage with a first input terminal to which an input signal is applied and with an output terminal that is connected to an input terminal of a second amplifier stage located downstream. The second amplifier stage provides an output signal that is fed back to a second input terminal of the first amplifier stage through a feedback path, which preferably contains a passive network. The amplification of this combination of the first and second amplifier stages with feedback depends essentially on the parameters of the network in the feedback path. The amplifier according to the invention also has a noise source that is connected in parallel with the first amplifier stage, and is also connected to the input terminal of the second amplifier stage. The level of a signal component at the output of the second amplifier stage depends on the parameters of the network in the feedback branch and the amplification of the first amplifier stage. These values are variable and can be adjusted such that the level of the signal component provided by the noise source is independent of the amplification of the amplifier.

One embodiment the passive network comprises a voltage divider, with one tap of the voltage divider connected to the second input terminal of the first amplifier stage. A k-fold multiple of the output signal at the second amplifier stage is applied to the second input terminal of the first amplifier stage, with the feedback factor k depending on the voltage divider ratio.

The amplification of the first amplifier stage may also be adjustable as a function of the feedback factor k. In one embodiment, the first amplifier stage contains a plurality of amplifiers connected in parallel that can be switched as a function of the feedback factor k. The amplifiers of the first amplifier stage are therefore preferably designed as differential amplifiers.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
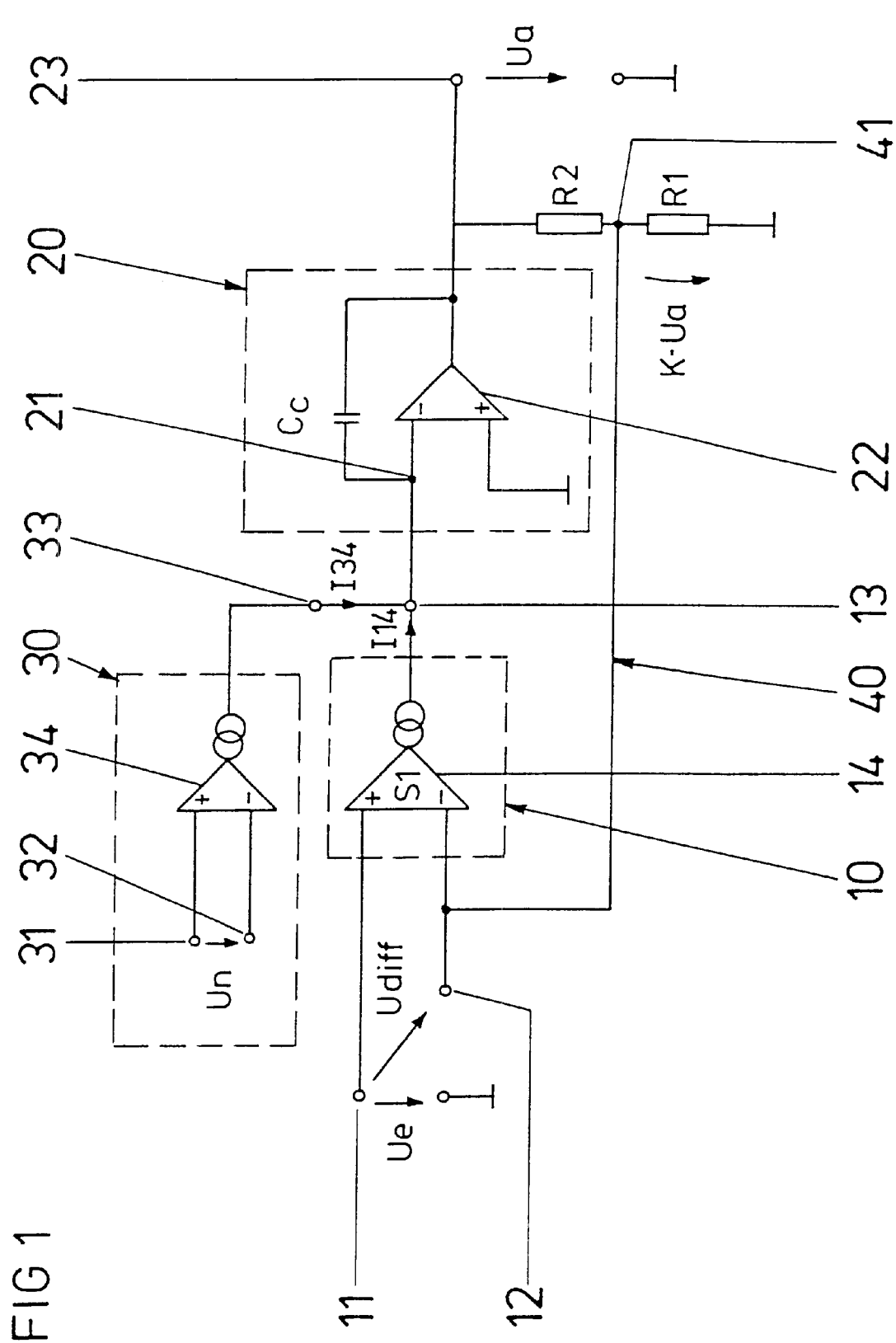
FIG. 1 illustrates a first embodiment of an amplifier according to the present invention.

FIG. 1 illustrates an amplifier that includes a first amplifier stage 10, a second amplifier stage 20 connected downstream of the first amplifier stage 10, a noise source 30 and a feedback path 40. The first amplifier stage 10 has a first input terminal 11 that receives an input signal Ue. Output terminal 13 of the first amplifier stage 10 is connected to an input terminal 21 of the second amplifier stage 20, which provides an output signal Ua at output terminal 23. The output signal Ua is capable of being supplied to an AD converter (now shown).

The output signal Ua at terminal 23 is fed back through a feedback path 40 to a second input terminal 12 of the first amplifier stage 10. The feedback path 40 includes a voltage divider comprising series connected first and second resistances R1, R2 respectively. Node 41 is common to the resistances R1, R2, and the signal at node 41 is fed back along the feedback path 40 to the second input terminal 12 of the first amplifier stage. The value of the signal fed back to the second input terminal is (k·Ua) where k=R1/(R1+R2).

In the embodiment set forth in FIG. 1, the first amplifier stage 10 has a differential amplifier 14 designed as a so-called transconductance amplifier. At the output of the differential amplifier 14 a current I14 is imposed that depends on the difference Udiff between the signals Ue and (k·Ua) at the input terminals 11, 12 respectively. When the differential amplifier 14 is operated within its control limits, small changes ΔUdiff affect the changes in the current I14. That is, ΔI14=(S1·ΔUdiff). S1 therefore represents the steepness of the differential amplifier 14 in the first amplifier stage 10.

The second amplifier stage 20 includes a differential amplifier 22 with a capacitance $C_c$ (referred to as Miller capacitor) connected between the output terminal 23 and the input terminal 21 of the second amplifier 22 for frequency-dependent voltage counter-coupling. Another input terminal (i.e., the positive input terminal) of the differential amplifier 22 is connected to a reference potential.

The combination of the first and second amplifier stages 10, 20 has a total amplification V that depends on the frequency of the input signal and therefore is a complex value. Therefore changes in the output signal Ua can be expressed as:

$$\Delta Ua = V \cdot \Delta U\text{diff},\qquad\text{(EQ. 1)}$$

where ΔUdiff represents the difference Udiff of the input signals. EQ. 1 is true of course when the output signal is within the control limits. Substituting for ΔUdiff yields:

$$\Delta Ua/\Delta Ue = V/(1+k \cdot V).\qquad\text{(EQ. 2)}$$

The value of the amplification V usually is between $10^4$ and $10^5$ so that ΔUa/ΔUe=1/k can be assumed for the amplification of small controls ΔUa/ΔUe=1/k. If the amplifier is operated within its control limits, Ua/Ue=1/k provided the angular frequency of the input signal Ue is smaller than the bandwidth $\omega_{BW}$ of the amplifier. The bandwidth $\omega_{BW}$ is expressed as:

$$\omega_{BW}=k \cdot \omega_T,\qquad\text{(EQ. 3)}$$

where $\omega_T$ is the transit frequency of the amplifier that is calculated as follows for an amplifier with a differential amplifier 14 as the first amplifier stage 10 and a Miller-compensated second amplifier stage 20 as follows:

$$\omega_T = S1/C_c.\qquad\text{(EQ. 4)}$$

The noise source 30 includes a differential amplifier 34 designed as a transconductance amplifier. A noise signal Un is applied between input terminals 31, 32 of the differential amplifier 34. A current I34 is then imposed at output 33 of the differential amplifier 34 for which:

$$\Delta I34 = Sn \cdot \Delta Un,\qquad\text{(EQ. 5)}$$

when the amplifier 34 is operated within its control limits, with Sn representing the steepness of the differential amplifier 34.

Changes ΔUn in the noise signal Un cause changes ΔUa in the output signal Ua as follows:

$$\Delta Ua = Sn/S1 \cdot \Delta Un \cdot 1/k.\qquad\text{(EQ. 6)}$$

This is because when the input signal Ue is assumed to be constant, changes in the noise signal Un cause changes ΔUa in the output signal Ua which, through the feedback path 40 at the second input terminal 12, cause a change k·ΔUa in the fed-back signal. This causes a change ΔI14 in the impressed current I14 at the output of the differential amplifier 14. This change in current I14 opposes the change ΔI34 in current I34, creating an equilibrium if ΔI34=ΔI14.

If we let ΔI34=Sn·ΔUn and ΔI14=S1·k·ΔUa and solve for ΔUa, the above-mentioned relationship set forth in EQ. 6 is obtained for the changes in the output signal Ua as a function of the noise signal Un.

In summary, controls ΔUe of the input signal Ue and ΔUn of the noise signal Un act as follows on the controls ΔUa of the output signal Ua:

$$\Delta Ua = (\Delta Ue + Sn/S1 \cdot \Delta Un)/k.\qquad\text{(EQ. 7)}$$

The signal component produced by the input signal Ue is then dependent only on the feedback factor k and hence on the parameters of the passive network of the feedback path 40, while the signal component produced by the noise signal Un depends on the feedback factor k and the steepness S1 of the first amplifier stage 10. In order to produce an amplification of the noise signal that is independent of the amplification 1/k of the useful signal Ue, the invention provides that the steepness of the first amplifier stage 10 is variable as a function of the feedback factor k. Feedback factor k can be changed by varying the resistances R1, R2 which are designed as potentiometers.

The steepness of the first amplifier stage 10 is then preferably:

$$S1 = \omega_{BW} \cdot C_c/k.\qquad\text{(EQ. 8)}$$

As a result, assurance is also provided that the bandwidth $\omega_{BW}$ of the amplifier (in other words the frequency range within which the amplification of the input signal Ue is constant) is independent of the amplification set using the feedback factor.

Figure 2:
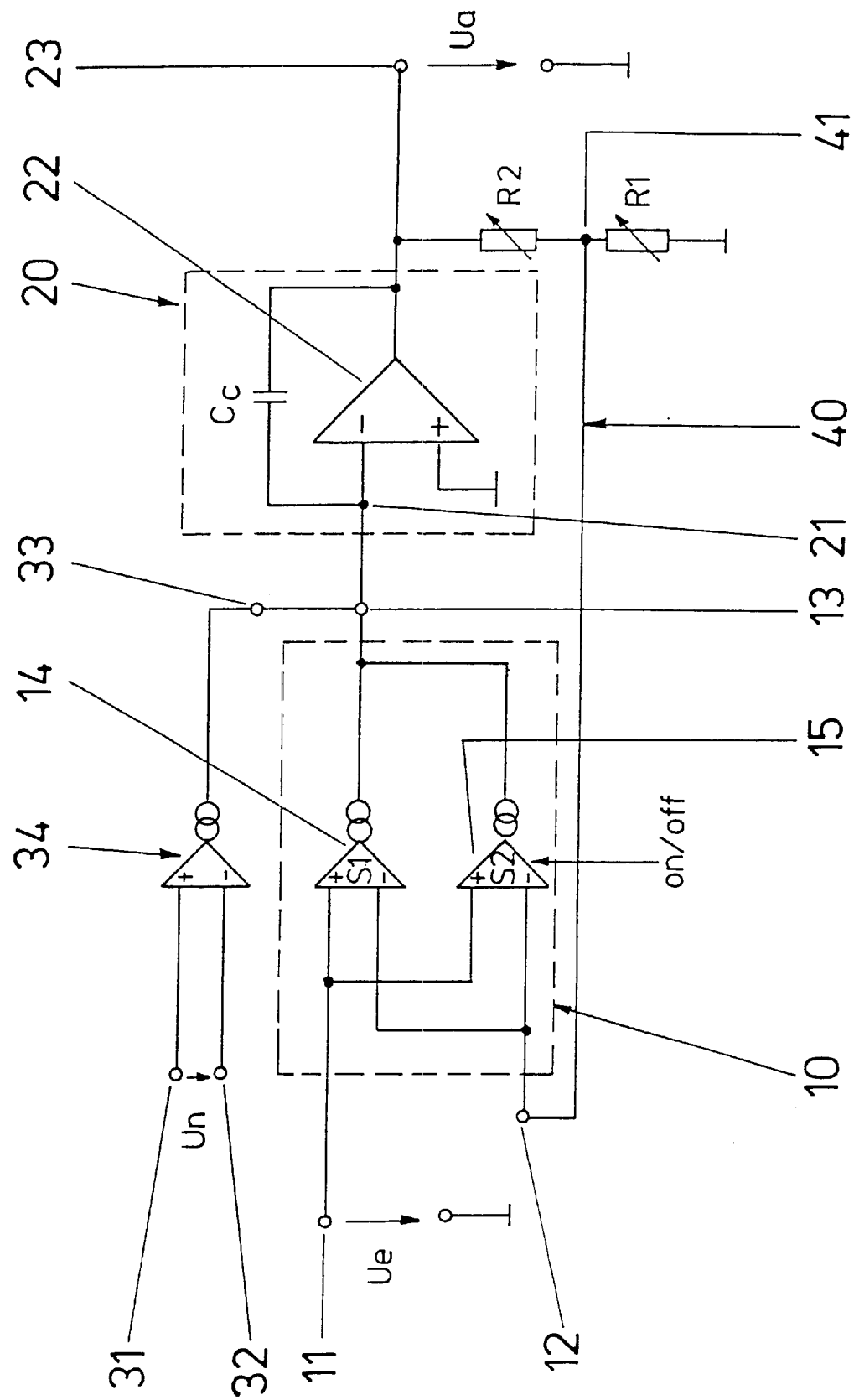
FIG. 2 illustrates a second embodiment of an amplifier according to the present invention.

Referring to FIG. 2, another embodiment of the invention provides for connecting a plurality of differential amplifiers 14, 15 in parallel for the first amplifier stage 10. One input terminal of the differential amplifier 14, 15 (in the example shown the non-inverting input terminal) is connected to the first input terminal 11 and one input terminal of differential amplifier 14, 15 is connected to the second input terminal 12 of the first amplifier stage 10. The outputs of the two differential amplifiers 14, 15 are fed back to the output terminal 13 of the first amplifier stage 10. Outputs of the two differential amplifiers 14, 15 are connected to the output terminal 13 of the first amplifier stage 10. Each of the two differential amplifiers 14, 15 is designed as a transconductance amplifier and supplies at its output a current that depends on the difference between the input signals Ue and K·Ua. The individual steepnesses S1, S2 of differential amplifiers 14, 15 are added together to form the total steepness S of the first amplifier stage, so that:

$$S = S1 + S2.\qquad\text{(EQ. 9)}$$

The same applies to the parallel connection of other differential amplifiers. As shown in FIG. 2 by a control line labeled "on/off", differential amplifier 15 can be switched on or off in order to change the steepness of the first amplifier stage 10 when feedback factor k changes, and thus to achieve an amplification of the noise signal independent of the amplification 1/k of useful noise signal Un as well as a constant bandwidth $\omega_{BW}$. In the present case, two different steepnesses S=S1 and S=S1+S2 can be adjusted. Similarly two amplifications 1/k are possible which can be calculated using the relationship set forth in EQ. 8 and for which the amplification of the noise signal Un is independent of the amplification of the input signal Ue. If the differential amplifier 14 can also be switched on separately, and S1 is not equal to S2, three different amplifications are possible for the embodiment shown in FIG. 2, for which the above-mentioned relationships apply. One of ordinary skill will recognize that the number of possible amplifications increases with the number of differential amplifiers connected in parallel for the first amplification stage 10.

Figure 3:
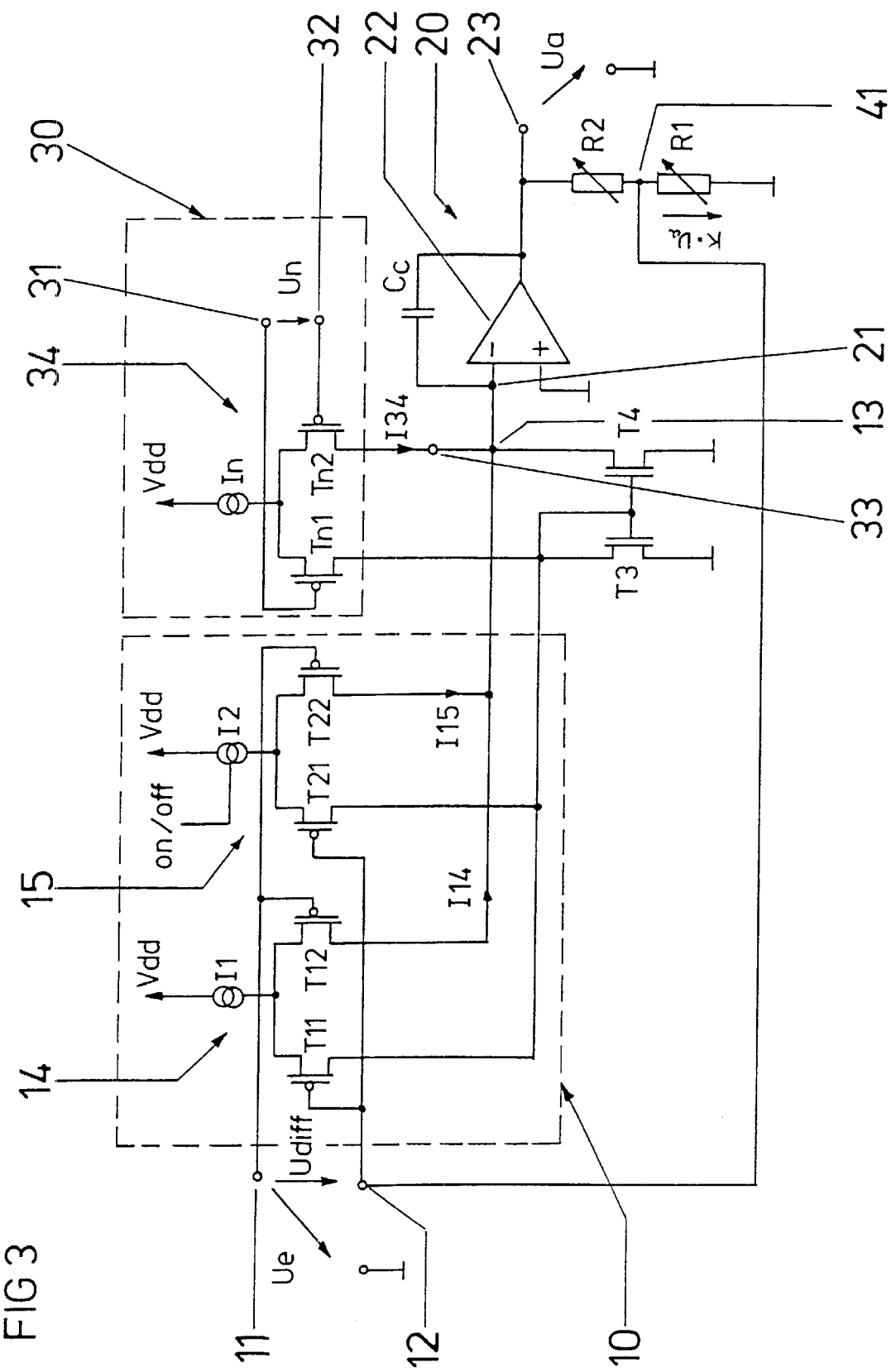
FIG. 3 is a detailed schematic illustration of an embodiment of the amplifier illustrated in FIG. 2.

FIG. 3 is a detailed schematic illustration of the amplifier illustrated in FIG. 2. The differential amplifier for a first amplifier stage 10 and the noise source 30 are formed by a current source I1; I2; In and transistor pairs T11, T12; T21, T22; T1n, T2n which have in common a current level formed by two transistors T3, T4. The transistors of a transistor pair are preferably identical. Transistors T11 , T12, T21, T22, Tn1, Tn2 in the embodiment shown are in the form of p-channel transistors while transistors T3, T4 of the current level are n-channel transistors.

Transistor pairs T11, T12; T21, T22; Tn1, Tn2 are connected with their load sections in series with the respective current sources I1, I2, In with current sources I1, I2, In being connected to a supply potential Vdd. Each of the transistors T11 , T21, Tn1 of the differential amplifiers 14, 15, and 34 is connected in series with transistor T3 of the current level while the other transistor T12, T22, Tn2 of the differential amplifiers 14, 15, and 34 is connected in series with transistor T4 of the current level.

The gate terminals of transistors T11, T21 of differential amplifiers 14, 15 are connected to the first input terminal 11, while the gate terminals of transistors T12, T22 are connected to the second input terminals 12 of the first amplifier stage 10. Differential amplifiers 14, 15 supply a current I14, I15 to output terminal 13 (and the input terminal 21) of the second amplifier stage 20 which depends on the difference between the signals Ue and k·Ua present between input terminals 11, 12 and in each case corresponds at most to the current supplied through current sources I1, I2. Steepnesses S1, S2 of differential amplifiers 14, 15 depend on the steepnesses of transistors T11, T12, T21, T22 for the current delivered through current sources I1, I2.

The gate terminals of transistors Tn1, Tn2 of noise source 34 are connected to the first and second input terminals 31, 32 of the noise source to which the noise signal Un is applied.

Current source I2 of the differential amplifier 15 in this embodiment is designed so that it can be switched on and off in order to turn the differential amplifier 15 on and off to vary the total steepness S of the first amplifier stage 10.

The second amplifier stage 20 in all the embodiments is connected as an inverting amplifier. However, one of ordinary skill in the art will recognize that the use of a non-inverting amplifier may also be used.

Although the present invention has been shown and described with respect to several preferred embodiments thereof, various changes, omissions and additions to the form and detail thereof, may be made therein, without departing from the spirit and scope of the invention.

What is claimed is:

1. An amplifier for an analog-digital converter, comprising:

a first amplifier stage comprising a first input terminal responsive to an amplifier input signal (Ue), a second input terminal and an first stage output terminal;

a second amplifier stage comprising a second stage input terminal connected to said first stage output terminal, and providing an output signal (Ua) at a second stage output terminal;

a feedback path disposed between said second stage output terminal and said second input terminal to feedback a signal indicative of said output signal (Ua); and a noise source that provides a noise signal that is provided on a noise source output terminal that is connected to said second stage input terminal.

2. The amplifier of claim 1 wherein said feedback path comprises a passive network that provides said signal indicative of said output signal (Ua) wherein said signal is a k-fold multiple of said output signal (Ua), where $0 \leq k \leq 1$.

3. The amplifier of claim 2, wherein said passive network comprises:

a voltage divider having a tap connected to said second input terminal of said first amplifier stage.

4. The amplifier of claim 3, wherein said voltage divider comprises means for adjusting the feedback factor k to control the gain of said first amplifier stage.

5. The amplifier of claim 4, wherein said first amplifier stage comprises at least one differential amplifier stage.

6. The amplifier of claim 5, wherein said first amplifier stage comprises a first differential amplifier including a first differential input connected to said first stage first terminal and a second differential input connected to said first stage second terminal, and a differential amplifier output terminal that provides a signal on said first stage output terminal.

7. The amplifier of claim 6 wherein said first amplifier stage has at least a second differential amplifier connected in parallel with said first differential amplifier, wherein said second differential amplifier includes a first polarity differential input connected to said first stage first terminal and a second polarity differential input connected to said first stage second terminal, and a second differential amplifier output terminal that provides a signal on said first stage output terminal.

8. The amplifier of claim 7, further comprising means for turning on and off said second differential amplifier as a function of said feedback factor k.

9. The amplifier of claim 7, wherein said first differential amplifier and said second differential amplifier comprise transconductance amplifiers.

10. The amplifier of claim 4, wherein said noise source comprises a noise source differential amplifier having input terminals responsive to a noise signal (Un), and which provides an output noise signal on said noise source output terminal.

11. The amplifier of claim 10 wherein said second amplifier stage comprises an amplifier in which a capacitance ($C_c$) is connected between said second stage output terminal and said second stage input terminal.

12. An amplifier, comprising:

a first amplifier stage comprising a first input terminal responsive to an amplifier input signal (Ue), a second input terminal and an first stage output terminal;

a second amplifier stage comprising a second stage input terminal connected to said first stage output terminal, and providing an output signal (Ua) at a second stage output terminal;

a variable gain feedback path disposed between said second stage output terminal and said second input terminal to feedback a signal indicative of said output signal (Ua); and a noise source that provides a noise signal on an output terminal that is connected to said second stage input terminal.

* * * * *